Jan. 24, 1956

D. C. FELT ET AL

TUNING MECHANISM 2,731,837

Filed Jan. 2, 1952

2 Sheets-Sheet 1

INVENTORS
DAVID C. FELT
CLIFFORD D. NESTLERODE
BY
Darby & Darby
ATTORNEYS

Jan. 24, 1956 D. C. FELT ET AL 2,731,837
TUNING MECHANISM
Filed Jan. 2, 1952
2 Sheets-Sheet 2
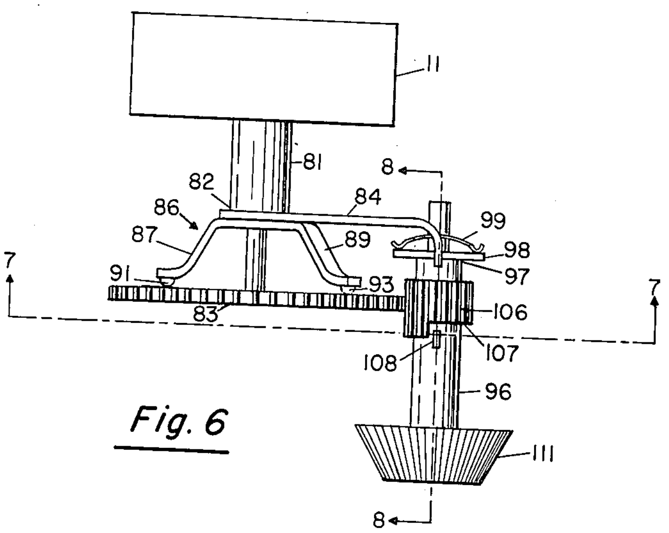
Fig. 6
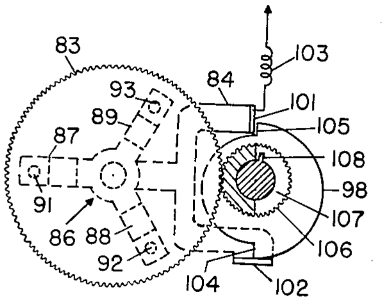
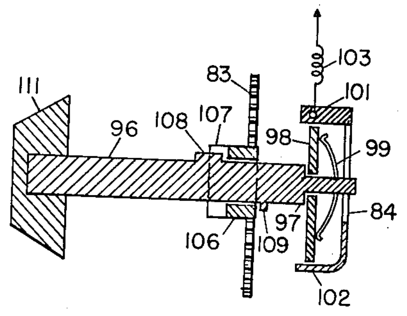
Fig. 7 Fig. 8
INVENTORS
DAVID C. FELT
CLIFFORD D. NESTLERODE
BY
Darby & Darby
ATTORNEYS

United States Patent Office 2,731,837

Patented Jan. 24, 1956

2,731,837

TUNING MECHANISM

David C. Felt, Teaneck, and Clifford D. Nestlerode, Fairlawn, N. J., assignors to Allen B. Du Mont Laboratories, Inc., Clifton, N. J., a corporation of Delaware Application January 2, 1952, Serial No. 264,574

5 Claims. (Cl. 74—10.54)

This invention relates to tuning mechanisms and particularly to such mechanisms which have provision for combined coarse and vernier tuning.

In certain devices, such as radio and television receivers, it is desirable to be able to rotate a tuning shaft quickly or coarsely to tune in a station and it is also desirable to be able to rotate the tuning shaft slowly or vernierly to achieve precise tuning. Certain other devices also require that a shaft be rotated coarsely and vernierly at will.

An object of the invention is to provide a tuning mechanism having means for both coarse and vernier tuning.

Another object is to provide a tuning mechanism having means for achieving coarse and vernier tuning with a single tuning knob.

A further object is to provide a tuning mechanism having adjustable detent tuning means for a plurality of predetermined dial settings.

Other objects will be apparent.

In accordance with the invention, a drive plate is rigidly fixed to a tuning shaft. A direct-drive member is mechanically coupled to the tuning shaft, and a vernier driving arm engages the drive plate and is actuated by a link arm and cam mechanism.

In the drawing,

Figure 6 shows a top view of an alternative embodiment of the invention which provides continuous tuning;

Figure 7 is a sectional view taken on the line 7—7 of Figure 6; and

Figure 8 is a sectional view taken on the line 8—8 of Figure 6.

Figure 1:
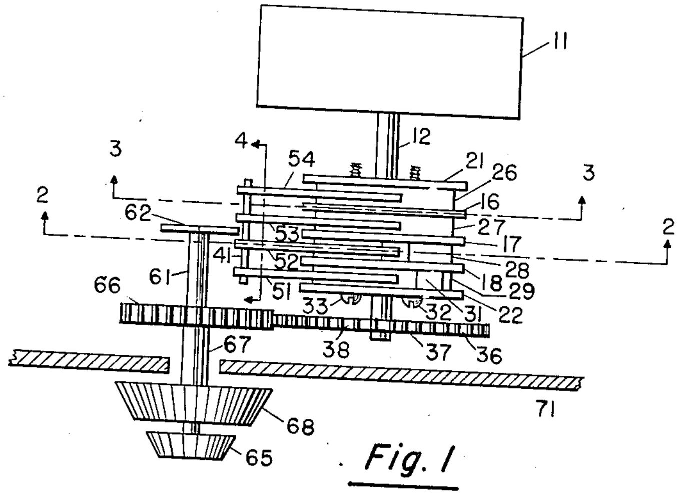
Figure 1 shows a top view of an embodiment of the invention having a plurality of selectively preset detent drive plates.
Figure 2:
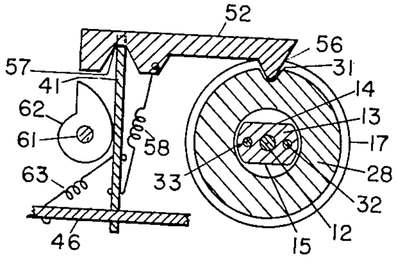
Figure 2 is a sectional view taken on the line 2—2 of Figure 1.
Figure 3:
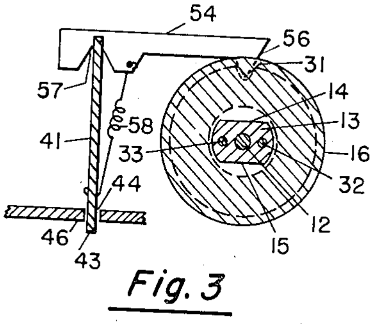
Figure 3 is a sectional view taken on the line 3—3 of Figure 1.
Figure 4:
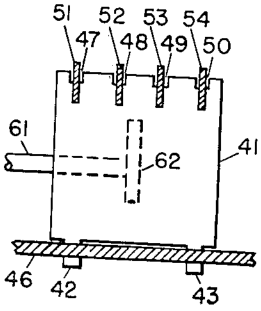
Figure 4 is a sectional view taken on the line 4—4 of Figure 1.

In the embodiment of Figures 1 through 5, a device 11 to be tuned has a tuning shaft 12 extending therefrom. Attached to the shaft 12 is a cylindrical member 13 having flatted surface portions 14, 15 thereon. A plurality of spacer disks 16, 17, 18 are positioned on the cylindrical member 13 so as to be axially slidable with respect thereto and at the same time non-rotatable with respect thereto because of the flatted surfaces 14, 15. End plates 21, 22 are positioned on the shaft 12 as shown. Detent disks or drive plates 26, 27, 28, 29 are interspersed among the end plates and spacer disks. These detent disks are positioned on the cylindrical member 13 by means of circular openings so that the detent disks may be free to rotate with respect to the cylindrical member 13. Each of the detent disks 26, 27, 28, 29 is provided with a detent 31 on the circumference thereof. Clamping screws 32, 33, extend through the assembly comprising the end disks and cylindrical member, and are threaded into the rear end plate 21 so that the detent disks may be clamped rigidly with respect to the tuning shaft 12. To facilitate clamping, the rear end plate 21 preferably is positioned to be axially movable. A gear 36 is affixed to the shaft 12. Openings 37, 38 in the gear 36 provide access to the clamping screws 32, 33.

A link arm 41 is provided with tabs 42, 43 which project into openings 44 in a mounting plate 46 which is fixedly positioned with respect to the tuning device 11. The openings 44 are sufficiently large to allow the link arm 41 a limited motion about the pivot formed by the taps 42, 43 in the openings 44. Recesses 47, 48, 49, 50 are provided at the top of the link arm 41 into which vernier driving arms 51, 52, 53, 54 are pivotally positioned. Each link arm comprises a projection 56 adapted to engage the detents 31 of the respective detent disks. Each driving arm has a notch 57 near an end thereof which engages its respective recess in the link arm 41. Tension springs 58 are connected one between each driving arm and the link arm 41, so as to resiliently force the projection 56 of each driving arm against its respective detent disk 26, 27, 28, 29.

A vernier tuning shaft 61 is rotatably supported in fixed position with respect to the tuning shaft 12. A cam member 62 is attached to the vernier tuning shaft 61. A spring 63 is connected between the link arm 41 and support plate 46 to resiliently urge the link arm against the surface of the cam 62. A vernier tuning knob portion 65 is attached to an end of the vernier shaft 61. A coarse tuning drive mechanism comprising a gear 66, a hollow shaft 67 and a coarse tuning knob portion 68 is rotatably positioned on the vernier tuning shaft 61 so that the gear 66 engages the gear 36. The hollow shaft 67 extends through a panel 71, which panel may be part of a cabinet which houses the tuning mechanism. The tuning knob comprises the portions 65 and 68 which are positioned in coaxial adjacency.

Figure 5:
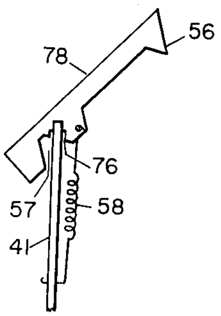
Figure 5 shows a detail of the vernier driving arm used in the embodiment of Figure 1.

Figure 5 shows an auxiliary slot 76 positioned adjacent the notch 57 in a driving arm 78 which may be any of the aforesaid driving arms 51, 52, 53, 54. Thus, the driving arm 78 may be temporarily disengaged from its respective detent plate by raising the driving arm so that the notch 76 engages the link arm 41 as shown in Figure 5.

Now referring to the embodiment shown in Figures 6, 7 and 8, the device 11 to be tuned has a tuning shaft 81 extending therefrom. The shaft 81 has a shoulder 82 thereon. A drive plate 83 is attached to an end of the tuning shaft 81. A link arm 84 is positioned against the shoulder 82. A vernier driving arm 86 is positioned between the link arm 84 and the drive plate 83, and is fixedly attached to the link arm 84. The driving arm 86 comprises a plurality of arms 87, 88, 89 which frictionally engage against the drive plate 83. The arms 87, 88, 89 are preferably made from resilient material. Dimples 91, 92, 93 are formed in the respective arms to provide a frictionally slidable bearing surface against the drive plate 83.

A drive shaft 96 is rotatably positioned in fixed relationship with respect to the tuning shaft 81 and has a shoulder 97 thereon. A cam member 98 is positioned on the shaft 96 against the shoulder 97. A retainer spring 99 holds the cam 98 in frictional engagement with the shoulder 97. The link arm 84 is provided with shoulders 101 and 102, the shoulder 101 being vertical and extending across the top surface of the cam 98. The shoulder 102 is positioned horizontally against the bottom edge of the cam 98. A spring 103 urges the bottom shoulder 102 of the link arm 84 against the surface of the cam 98. The shoulder 101 is positioned to serve as a stop for the cam 98, the cam 98 having shoulders 104 and 105 which abut against the shoulder 101 when the cam 98 is turned approximately one half turn. A pinion gear 106 is positioned on the shaft 96 and engages teeth on the drive plate 83. The pinion gear 106 is provided with a shoulder 107; a projection 108 on the shaft 96 is positioned in the confines of the shoulder 107 so that the shaft 96 will have approximately one half turn of free rotation or lost motion before it drives the pinion gear 106. A second projection 109 on the shaft 96 limits axial movement of the gear 106. A single tuning knob 111 is attached to the shaft 96.

The invention operates as has heretofore been recited, viz., a drive plate, such as the detent disks 26, 27, 28, 29 or the gear 83 is attached to a tuning shaft. The tuning shaft may be coarsely driven by a direct drive means, such as the gears 83, 106 or the gears 36, 66. Vernier tuning is accomplished by means of a vernier driving arm (51, 52, 53, 54, or 86) which engages the drive plate. The vernier driving arm is actuated by a link arm (41 or 84) which in turn is actuated by a cam (62 or 98).

In the species of Figures 1 through 5 the detent drive plates are adjusted as follows: All of the driving arms except one are temporarily disengaged from their respective detent plates, as shown in Figure 5. The remaining driving arm engages its respective detent 31; the cam 62 is set in an intermediate position. The clamping screws 32, 33 are loosened to allow rotation of the individual drive plates. The tuning shaft 12 is tuned to the desired position of a particular dial setting, in order to correctly position the detent drive plate. Succeeding driving arms are similarly engaged against their respective detents one at a time and their respective drive plates adjusted to the desired position. The spacer plates 16, 17, 18 being nonrotatable, allow the aforesaid individual adjustments of the detent plates. When all drive plates are properly set so that different desired tuning positions of the shaft 12 are achieved when the respective detents engage against an individual driving arm, the clamping screws 32, 33 are tightened thereby rigidly clamping the drive plate assembly, and all driving arms are positioned to engage their respective drive plates.

To tune in a station, the coarse knob portion 68 is tuned until the respective detent for the desired station engages its driving arm, as is indicated by "feel" or by a "click." Indicia may be placed on the knob 68 or on the panel 71 to indicate the desired tuning position. To achieve vernier tuning, the vernier knob portion 65 is turned, thereby rocking the link arm 41 by means of the cam 62 which in turn causes all of the driving arms 51, 52, 53, 54 to move laterally along the circumferences of the drive plates 26, 27, 28, 29; the drive plate into the detent of which a driving arm is engaged will thus be vernierly rotated over a limited angle because of frictional engagement of the drive arm projection 56 against the detent 31. The detent 31 must be sufficiently shallow so that the drive arm will ride out of the detent when the device is coarsely tuned.

The embodiment of Figures 6 through 8 functions as follows: For coarse tuning, the knob 111 is turned until the projection 108 drives the pinion gear 106 thereby rotating the gear 83 and tuning shaft 81. When the shaft 81 has been tuned slightly past the desired setting, which setting may be indicated by well-known means such as a "tuning eye" tube, the knob 111 is rotated backwards, over a maximum range of approximately one half turn. When thus rotated backwards, the projection 108 disengages from the direct drive pinion gear 106 over the range of approximately one half turn. During this vernier rotation over one half turn, the cam 98 is rotated by means of its frictional abutment against the shoulder 97 and thereby rocks the link arm 84 over a limited angle whereby the driving arm 86, being attached to the link arm 84, rotates the drive plate 83 by virtue of its frictional engagement therewith. Thus, the device may be precisely tuned by a vernier adjustment over the limited angle of approximately one half turn of the knob 111. When it is desired to tune the device 11 to another setting, the knob 111 is turned until the pinion gear 106 is again engaged by the projection 108 whereupon the shaft 81 is rapidly adjusted to the new desired setting. During this coarse tuning, the cam 98 is stopped from rotation by virtue of one of the shoulders 104 or 105 abutting against the link arm shoulder 101; however, the shaft 96 is capable of continued rotation because of the sliding frictional contact between the shoulder 97 and cam 98. During the coarse tuning, the link arm 84 and the vernier driving arm 86 remain stationary, and the drive plate 83 slides with respect to the bearing surfaces provided by the dimples 91, 92, 93. It will be seen that the slidably mounted cam 98 and driving arm 86 provide the vernier driving means when the pinion gear 106 is disengaged by virtue of the shaft 96 being turned so that the projection 108 rides within the shoulder 107 of the gear 106; however, when the projection 108 engages the pinion gear 106, thereby directly driving the drive plate 83, the cam and driving arm are free to slide with respect to their respective bearing surfaces.

While preferred embodiments of the invention have been described in detail, other embodiments and ramifications will be apparent to those skilled in the art. The true scope of the invention is defined by the appended claims.

What is claimed is:

1. A tuning mechanism comprising a tuning shaft, a plurality of drive plates positioned on said shaft, a detent formed in the surface of each respective drive plate, a plurality of driving arms each having a projection and positioned so that each projection engages the surface of a respective drive plate, means to rotate said drive plates to selectively engage said detents with said projections, means to move said driving arms laterally with respect to the axis of said drive plates said means comprising a link arm to which said driving arms are coupled, and a rotatable cam positioned against said link arm.

2. The mechanism in accordance with claim 1, including spacer disks positioned between said drive plates said spacer disks having generally rectangular axial openings therein, said shaft having flatted portions thereon to prevent said spacer disks from rotating with respect to said shaft.

3. The mechanism in accordance with claim 2, including front and rear disks and screw means clamping said drive plates and spacer disks together, said screw means being releasable to permit said drive plates to be rotatably adjusted on said shaft.

4. The mechanism in accordance with claim 1, including means to selectively disengage said driving arms from said drive plates.

5. The mechanism in accordance with claim 1, including a shaft on which said cam is fixed, a sleeve on said shaft, a gear fixed on said sleeve, and a meshing gear fixed on said tuning shaft, said sleeve and said cam shaft having adjustment knobs thereon whereby coarse and fine adjustment of said tuning shaft may be readily effected by rotation of immediately adjacent knobs.

References Cited in the file of this patent

UNITED STATES PATENTS

| | | |
|---|---|---|
| 1,583,281 | Curtis | May 4, 1926 |
| 1,599,548 | Baggott | Sept. 4, 1926 |
| 1,735,363 | Victoreen | Nov. 12, 1929 |
| 2,472,979 | May | June 14, 1949 |
| 2,594,667 | Lytle et al. | Apr. 29, 1952 |

FOREIGN PATENTS

| | | |
|---|---|---|
| 61,464 | Denmark | Feb. 3, 1941 |